(12) United States Patent
Yamashita et al.

(10) Patent No.: US 8,365,811 B2
(45) Date of Patent: Feb. 5, 2013

(54) HEAT SINK FAN

(75) Inventors: Takamasa Yamashita, Kyoto (JP); Takaya Otsuki, Kyoto (JP); Tatsuya Akase, Kyoto (JP)

(73) Assignee: Nidec Corporation, Kyoto (JP)

( * ) Notice: Subject to any disclaimer, the term of this patent is extended or adjusted under 35 U.S.C. 154(b) by 994 days.

(21) Appl. No.: 12/277,340

(22) Filed: Nov. 25, 2008

(65) Prior Publication Data
US 2009/0147478 A1 Jun. 11, 2009

Related U.S. Application Data

(60) Provisional application No. 61/012,119, filed on Dec. 7, 2007.

(51) Int. Cl.
*H05K 7/20* (2006.01)
(52) U.S. Cl. .................... 165/80.3; 165/121; 361/697
(58) Field of Classification Search ............... 165/80.3, 165/121, 185; 361/697
See application file for complete search history.

(56) References Cited

U.S. PATENT DOCUMENTS

| | | | |
|---|---|---|---|
| 6,557,626 B1 * | 5/2003 | O'Sullivan et al. ........... 165/121 |
| 6,782,941 B2 * | 8/2004 | Lee .............................. 165/80.3 |
| 7,123,483 B2 | 10/2006 | Otsuki et al. |
| D568,829 S * | 5/2008 | Yamashita et al. ........... D13/179 |
| D576,963 S * | 9/2008 | Mochizuki et al. .......... D13/179 |
| 7,495,921 B2 * | 2/2009 | Chang et al. ................. 361/719 |
| 7,583,503 B2 * | 9/2009 | Lin ............................... 361/704 |
| 2003/0115835 A1 * | 6/2003 | Kadota et al. .................. 53/410 |
| 2007/0253160 A1 * | 11/2007 | Lu et al. ........................ 361/695 |
| 2008/0030952 A1 | 2/2008 | Chen et al. |
| 2008/0080137 A1 * | 4/2008 | Otsuki et al. ................. 361/697 |
| 2008/0144278 A1 | 6/2008 | Yang et al. |
| 2008/0156461 A1 | 7/2008 | Otsuki et al. |
| 2009/0168351 A1 * | 7/2009 | Chen et al. .................... 361/697 |
| 2010/0051232 A1 * | 3/2010 | Zhao et al. ................... 165/80.3 |

* cited by examiner

*Primary Examiner* — Allen Flanigan
(74) *Attorney, Agent, or Firm* — Keating & Bennett, LLP

(57) ABSTRACT

A heat sink fan of the present invention includes a heat sink and a fan. The heat sink includes a base having a center axis and a plurality of fins extending radially outwardly from an outer circumference of the base and disposed in a circumferential direction. The fan includes an impeller portion disposed adjacently to the heat sink in the direction along the center axis, the impeller portion rotating about the center axis, and a frame portion for covering and fixing the impeller portion, part of the frame portion being opposed to the heat sink. The frame portion has at least one protruding portion. The protruding portion enters into a space between the fins which are adjacent to each other.

10 Claims, 12 Drawing Sheets

HEAT SINK FAN

BACKGROUND OF THE INVENTION

1. Field of the Invention

The present invention relates to a cooling device using a heat sink for cooling electronic components including an MPU.

2. Description of the Invention

An MPU (Micro Processing Unit) is an electronic component functioning as a central unit of a computer for performing processing such as a computation and other operations on received data, thereby obtaining output results. Such MPUs are loaded on various electronic apparatuses such as a server, a personal computer, and the like. In recent years, the clock frequency of the MPU is remarkably increased. Together with the increase in clock frequency, the heat generated from the MPU itself also has a tendency to increase. In some cases, the MPU may erroneously operate due to the generated heat. Accordingly, in order to maintain the performance of the MPU during the operation of the electronic apparatus, it is necessary to cool the MPU. For the purpose of cooling the MPU, a heat sink fan is installed in the inside of the electronic apparatus. The heat sink fan includes a heat sink configured by a plurality of heat radiating fins having a larger heat transfer area formed from a metal with high thermal conductivity, and a cooling fan for air-cooling the heat sink. The heat sink is installed in the inside of the electronic apparatus so as to be in contact with the MPU, thereby receiving the heat generated by the MPU. The heat transferred from the MPU to the heat sink is forcibly released to the exterior of the heat sink by means of airflow supplied from the cooling fan. As the result of the transfer of the heat to the heat sink, the MPU can normally operate without operating erroneously due to the heat generated by the MPU itself.

Generally, the cooling fan is disposed in a position opposed to the heat sink, and has an engaging portion for restricting a relative movement thereof with respect to the heat sink.

SUMMARY OF THE INVENTION

The heat sink fan of the present invention includes a heat sink and a fan. The heat sink includes a base having a center axis, and a plurality of fins extending radially outwardly from an outer circumference of the base, the plurality of fins being disposed in a circumferential direction. The fan includes an impeller portion which is adjacent to the heat sink in the direction along the center axis, the impeller portion rotating about the center axis, and a frame portion for covering and fixing the impeller portion, at least part of the frame portion being opposed to the heat sink. The frame portion has at least one protruding portion. The protruding portion enters into a space between the fins which are adjacent to each other.

In addition, the frame portion of the heat sink fan includes an annular member for enclosing the impeller portion, the annular member being opposed to the heat sink in the direction along the center axis. In the frame portion, the protruding portion can be formed on a face of the annular member which is opposed to the heat sink.

Moreover, the frame portion of the heat sink fan includes a plurality of first extending portions extending in the direction along the center axis from the annular member. At least part of the first extending portion is radially opposed to the fins has a cylindrical portion, and the first extending portion has a cylindrical portion at is end in the direction along the center axis. On an outer face of the cylindrical portion, a pawl portion protruding radially inwardly, and axially opposed to the heat sink is formed. The protruding portion can be formed on a face of the pawl portion opposite to the heat sink.

The frame portion of the heat sink fan further includes a plurality of second extending portions extending in the direction along the center axis from the annular member. The second extending portions are radially opposed to the fins. The protruding portion can be formed on a face of the second extending portion which is opposed to the fins in the direction along the center axis.

The frame portion of the heat sink fan includes a base portion to which the impeller portion is fixed, the base portion being opposed to the impeller portion in the direction along the center axis, and a coupling member for coupling the base portion with the annular member.

The at least one protruding portion formed in the frame portion has a shape which is tapered toward its extending direction. When the protruding portion is viewed from the direction along the center axis, all of the faces constituting the protruding portion are visible.

When viewed from the direction along the center axis, an outer shape of the heat sink of the heat sink fan is constituted by at least one arcuate portion which is substantially arcuate with respect to the center axis, and at least one side portion which is substantially linear. The first extending portion is opposed to the side portion.

A space in the circumferential direction between the fins constituting the side portion is smaller than a space in the circumferential direction between the fins constituting the arcuate portion.

When the protruding portion and the pawl portion are viewed from the direction along the center axis, an area enclosed by an outer shape of the protruding portion may be substantially equal to an area enclosed by an outer shape of the pawl portion. Moreover, at least one recessed portion which is recessed in the direction along the center axis may be formed on the heat sink, and the recessed portion may be engaged with the protruding portion.

The method for producing a heat sink fan of the present invention including: a heat sink including a base having a center axis, and a plurality of fins radially extending from an outer circumference of the base; and a cooling fan including an impeller portion rotating about the center axis, and a frame portion, the frame portion including an annular member for enclosing the impeller portion, a first extending portion axially extending from the annular member and having a pawl portion extending radially inwardly at its end, and a second extending portion axially extending from the annular member, one or more protruding portion being formed on at least one of the annular member, the first extending portion, and the second extending portion, includes the steps of: (A) heating and melding a resin material; (B) injecting the molten resin material into a metal die having a shape corresponding to the frame portion; (C) cooling and hardening the resin material in the metal die, thereby molding the resin material into the shape of the frame portion; (D) removing the resin material from the metal die, thereby forming the frame portion; (E) attaching the impeller portion to the frame portion; and (F) assembling the heat sink and the frame portion by inserting the protruding portion of the frame portion into a space between adjacent fins of the heat sink. By using the method for producing the heat sink fan, a heat sink fan can be produced.

DETAILED DESCRIPTION OF THE PREFERRED EMBODIMENTS

First, a heat sink fan 1 according to a first preferred embodiment of the present invention will be described. The heat sink fan 1 has a center axis J1. In the following description, a direction along the center axis J1 is referred to as an axial direction, and a direction perpendicular to the center axis J1 is referred to as a radial direction.

Figure 1:
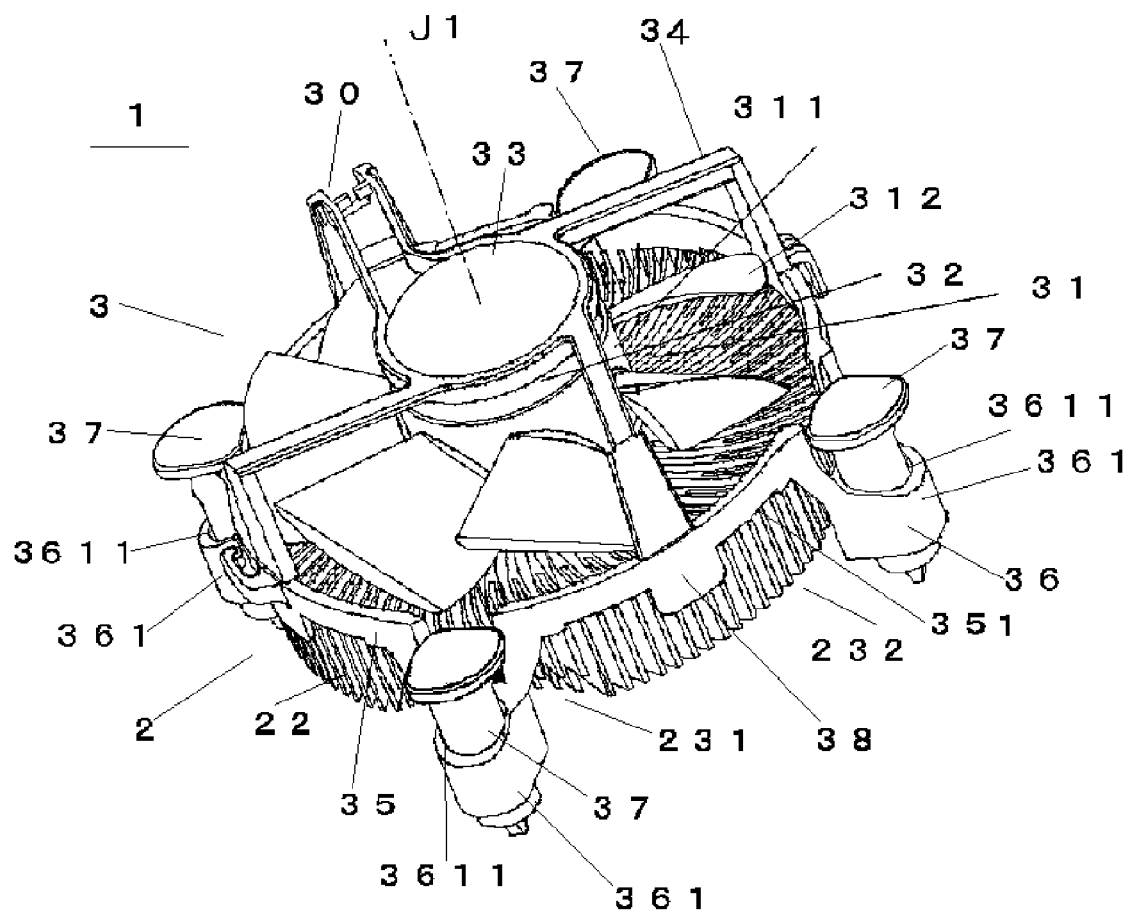
FIG. 1 is a perspective view of a heat sink fan.

FIG. 1 is a perspective view of the heat sink fan 1 having the center axis J1 according to the first preferred embodiment of the present invention. The heat sink fan 1 includes a heat sink 2 and a cooling fan 3 disposed on one end side of the heat sink 2 in the axial direction (on the upper side of FIG. 1). The center of the heat sink 2 and the center of the cooling fan 3 correspond to the center axis J1, respectively. The cooling fan 3 includes an impeller portion 31 which can rotate about the center axis J1. When the impeller portion 31 is rotatively driven by a motor portion 32, airflow is generated from the cooling fan 3 to the heat sink 2 in the axial direction. In the following description, in the axial direction, the side from which the air is taken in, i.e., the upper side of FIG. 1 is referred to as "an upper side" or "an air intake side", and the side from which the air is exhausted, i.e., the lower side of FIG. 1 is referred to as "a lower side" or "an air exhaust side". The representations of "the upper side" and "the lower side" do not necessarily agree with the upper side and the lower side with respect to the direction of gravity.

Figure 2:
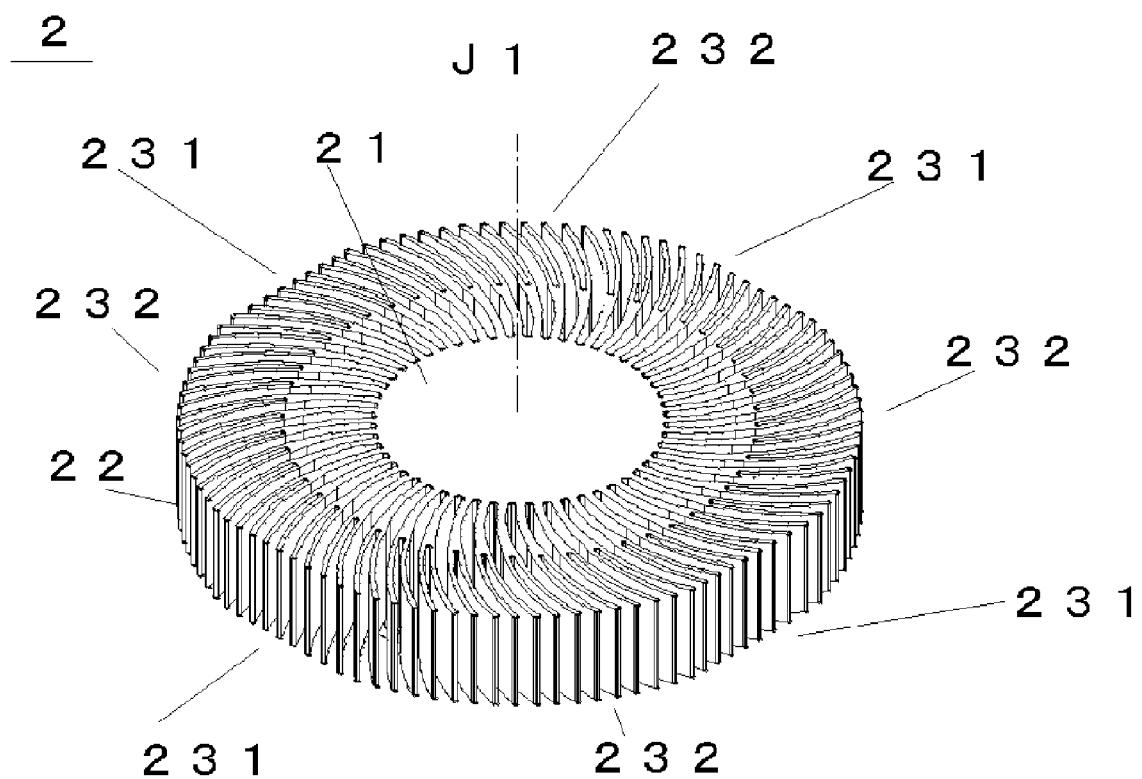
FIG. 2 is a perspective view of a heat sink.

FIG. 2 is a perspective view of the heat sink 2. In this embodiment, the heat sink 2 is a substantially columnar member having a substantially circular outer shape when it is viewed in plan from the side of the center axis J1. The heat sink 2 is made of a material such as aluminum, aluminum alloy, copper, or copper alloy having relatively higher thermal conductivity as compared with the other materials. The heat sink 2 is molded by extrusion, drawing, or other processes.

A column-like base 21 is disposed in the center of the heat sink 2. The base 21 is in contact with an object to be cooled such as an MPU via a thermal tape, thermal grease, or the like. On an outer circumference of the base 21, a plurality of thin-plate fins 22 extending outwardly in the radial direction from an outer peripheral surface of the base 21 are formed.

The respective fins 22 are arranged with regular pitches in a circumferential direction around the center axis J1. When the heat sink 2 is viewed in plan from the side of the center axis J1, each of the fins 22 is curved in such a manner that it is convex in the circumferential direction. In addition, an end of each fin 22 on the radially outer side is divided into two portions in the circumferential direction. With this configuration, airflow supplied from the cooling fan 3 easily enters into spaces between adjacent fins 22 in the circumferential direction. Moreover, a contact area between the fins 22 and the airflow supplied from the cooling fan 3 (i.e., a heat transfer area for releasing the heat transferred from an electronic component such as an MPU to the air) is increased, so that the airflow can more easily remove the heat from the fins 22. As a result, the object to be cooled such as the MPU can be efficiently cooled.

If radially outer end portions of the fins 22 of the heat sink 2 are virtually and continuously coupled in the circumferential direction with the center axis J1 as the center, an envelope surface 23 as a virtual surface is formed. When the heat sink 2 is viewed in plan from the center axis J1, the envelope surface 23 constitutes the substantially circular outer shape of the heat sink 2. When the envelope surface 23 is viewed in plan from the center axis J1, the envelope surface 23 includes a plurality of side portions 231 (four side portions in this embodiment) constituting substantially linear outer shape portions, and a plurality of arcuate portions 232 (four arcuate portions in this embodiment) constituting substantially arcuate outer shape portions around the center axis J1. In this embodiment, the side portions 231 and the arcuate portions 232 are alternately disposed in the circumferential direction around the center axis J1. Each of spaces between the fins 22 constituting the side portions 231 in the circumferential direction is narrower than each of spaces between the fins 22 constituting the arcuate portions 232 in the circumferential direction.

In this embodiment, the outer shape of the envelope surface 23 of the heat sink 2 when it is viewed in plan is substantially circular, but the outer shape is not limited to this. The outer shape may be a polygon such as a triangle or a square, an oval, or other shapes. The shape of the heat sink 2 is desirably a shape which can be formed by pressing process or drawing process.

Next, the configuration of the cooling fan 3 shown in FIG. 1 will be described. The cooling fan 3 includes the impeller portion 31 which is rotatively driven by the motor portion 32 around the center axis J1. The revolution of the impeller portion 31 generates airflow in the axial direction toward the heat sink 2. Due to the airflow, the heat sink 2 is forcibly cooled. The motor portion 32 is attached to a frame portion 30. In this embodiment, the frame portion 30 is configured as a single member formed by injection molding by using aluminum die cast and a resin, for example.

The injection molding is a working process in which a material such as a resin is molten, and injected into a metal die while applying a pressure, and then the material is cooled and hardened, thereby producing a component. A component having a complicated shape can be produced by one working process, so that the injection molding is suitably used for quantity production. By optimizing a structure of a metal die and molding conditions, the working can be realized up to a size accuracy of about ±0.1 to ±0.05, for example. In addition, there are two kinds of metal dies used for the injection molding, i.e., a fixed metal die and a movable metal die. By combining the two kinds of metal dies, one metal die can be constituted.

As shown in FIG. 1, the impeller portion 31 includes a substantially cylindrical impeller cup 311 with a cover, and a plurality of vanes 312 which are disposed in the circumferential direction around the center axis J1 on the outer periphery of the impeller cup 311. The impeller cup 311 and the vanes 312 are integrally formed by injection molding using a resin. In the interior of the impeller cup 311, the motor portion 32 connected to the impeller cup 311 via a shaft (not shown) is disposed. The motor portion 32 rotatively drives the impeller portion 31 by a current supplied from an external power supply (not shown) via a lead wire (not shown).

Figure 3A:
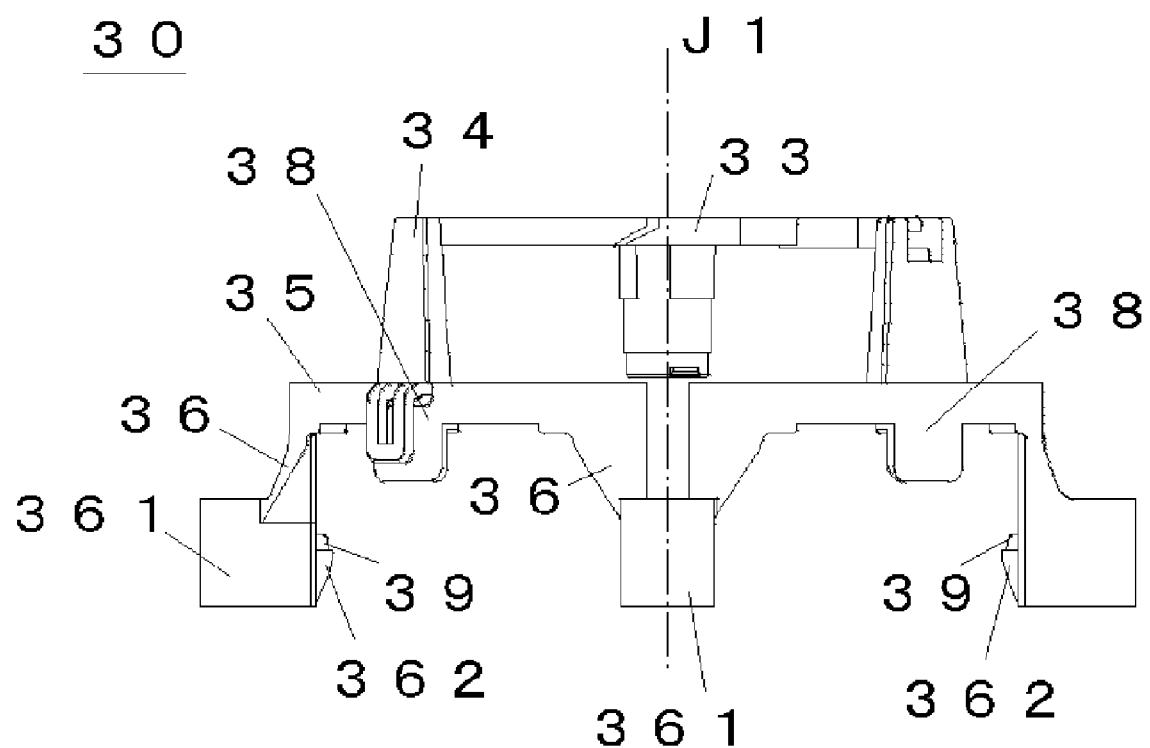
FIG. 3A is a side view of a frame portion of a cooling fan in a first preferred embodiment of the present invention.

As shown in FIGS. 1 and 3A, on an upper side of the motor portion 32 of the frame portion 30 in the axial direction, a base portion 33 is formed. The base portion 33 has a disk-like shape, and supports the motor portion 32. On the outer periphery of the base portion 33, one end of a substantially L-shaped coupling member 34 is integrally formed. The coupling member 34 extends radially outwards from the side of the center axis J1, and extends downwardly in the axial. The other end of the coupling member 34 which is different from the end connected to the base portion 33 is coupled to an annular member 35. The annular member 35 is disposed on the upper side of the heat sink 2 in the axial direction, and the annular member 35 encircles the impeller portion 31.

Figure 3B:
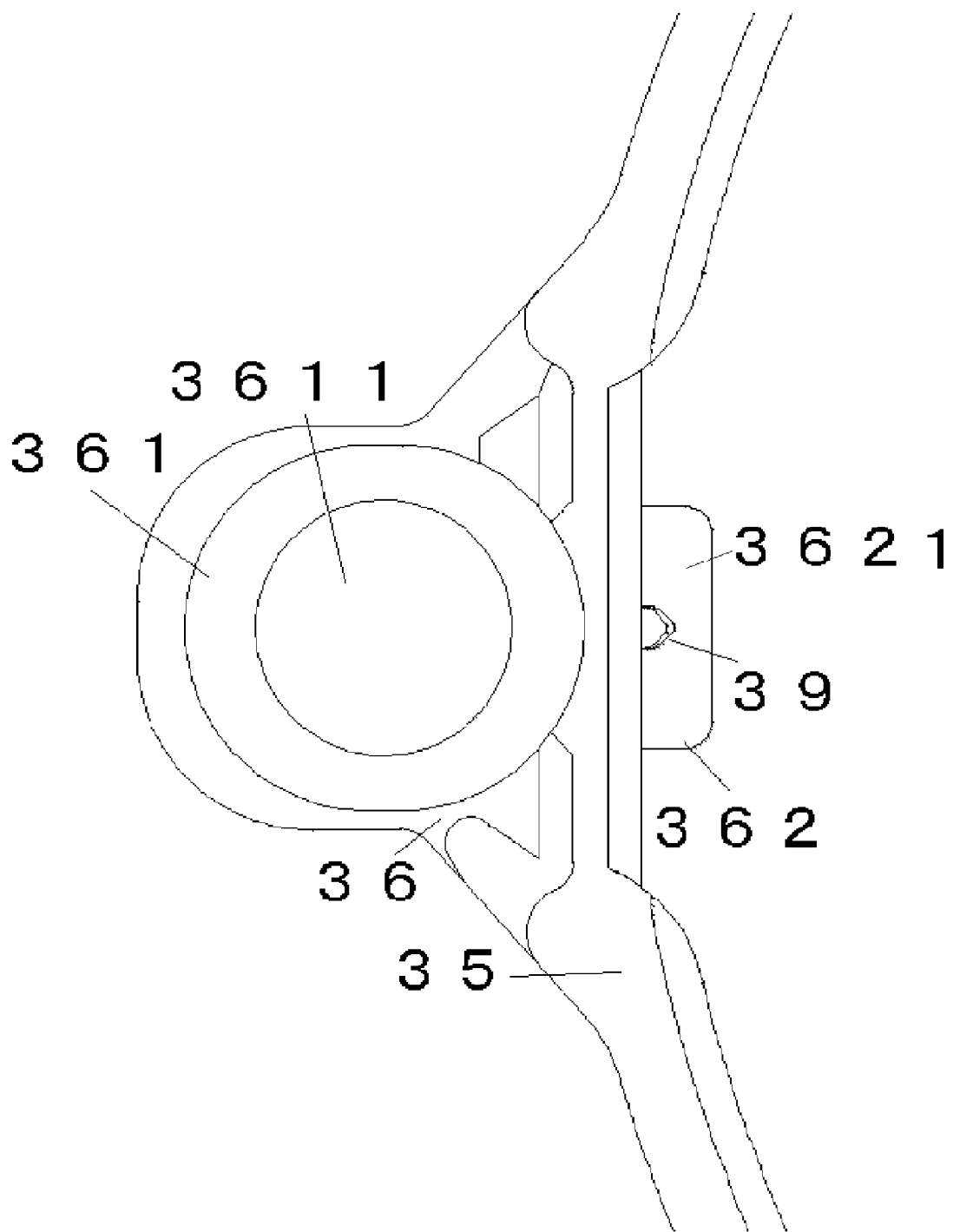
FIG. 3B is a partially enlarged view of the frame portion of the cooling fan in the first preferred embodiment.

As shown in FIGS. 1, 3A and 3B, the annular member 35 has substantially the same diameter as that of the substantially circular outer shape of the heat sink 2, when it is viewed in plan from the axial direction. The annular member 35 has a bottom face 351 which is substantially perpendicular to the center axis J1. The bottom face 351 axially abuts against an end face of the fins 22 on the radially outer side. With this configuration, even when any impact is made on the heat sink fan 1 from the external, since the bottom face 351 axially abuts against the fins 22, the relative movement of the heat sink 2 and the cooling fan 3 in the axial direction can be restricted.

The annular member 35 has a plurality of first extending portions 36 (four in this embodiment) are formed. The first extending portion 36 extends downwardly in the axial direction, and an inner circumferential face thereof is radially opposite to the side portion 231 of the heat sink 2. Since the first extending portions 36 are radially opposite to the side portions 231, even when any impact is made on the heat sink fan 1 from the external, the radially relative movement of the heat sink 2 and the cooling fan 3 can be restricted.

As shown in FIGS. 1, 3A, and 3B, a cylindrical member 361 having a through hole 3611 is formed at the end of each of the first extending portions 36 on the radially outer side. As shown in FIG. 1, into the through holes 3611 of the cylindrical members 361, pins 37 are inserted, respectively. The pins 37 are used for fixing the heat sink fan 1 to a circuit board or the like on which electronic components such as MPU are mounted. It is understood that the fixing means for fixing the heat sink fan 1 to an electronic component or a member on which the electronic component is fixed is not limited to the pins 37. Instead of the pins 37, screws, rivets, and other members may be used. Alternatively, as the fixing means, the pins 37 may be used in combination with other fixing means such as screws. The fixing means is not limited specifically.

As shown in FIG. 3A, on the faces of the radially inner side of the cylindrical members 361 of a pair of first extending portions 36 which are radially opposite to each other with the center axis J1 interposed therebetween, pawl portions 362 protruding radially inwardly are formed, respectively. As shown in FIG. 3A, each pawl portion 362 has a parallel face 3621 on the upper side in the axial direction which is substantially parallel to the end face of the fins 22 on the lower side in the axial direction. When the heat sink 2 and the cooling fan 3 are combined, the parallel face 3621 abuts against the end face on the lower side in the axial direction of at least one of the fins 22 constituting the side portion 231. Accordingly, even when any impact is made on the heat sink fan 1 from the external, the axially relative movement of the heat sink 2 and the cooling fan 3 is restricted, so that the heat sink 2 is stably held by the cooling fan 3.

In addition, on the parallel face 3621 of the pawl portion 362, a protruding portion 39 is formed. As shown in FIGS. 3A and 3E, the protruding portion 39 has a substantially triangular pole shape which is tapered toward the axially upper side. The protruding portion 39 is inserted into a space between adjacent fins 22 constituting the side portion 231 when the heat sink 2 and the cooling fan 3 are combined. As described above, the space between the adjacent fins constituting the side portion 231 is smaller than the space between the adjacent fins 22 constituting the arcuate portion 232. For this reason, when the protruding portion 39 enters into the space between the adjacent fins 22 constituting the side portion 231, the protruding portion 39 is sandwiched between the fins 22 in such a manner that the protruding portion 39 abuts against the fins 22. Accordingly, even when the heat sink 2 and the cooling fan 3 are relatively moved in the circumferential direction by the impact or the like from the external, the circumferential relative movement of the heat sink 2 and the cooling fan 3 is restricted by means of the protruding portion 39. Additionally, the parallel faces 3621 of the pawl portions 362 are arranged such that they will engage with less than all of the end faces of the fins 22. Therefore, the heat sink 2 is stably held by the cooling fan 3.

As described above, the protruding portion 39 has the substantially triangular pole shape which is tapered toward the axially upper side. An axially lower portion of the protruding portion 39 is integrally formed with the parallel face 3621, and has a larger sectional area in a plane perpendicular to the center axis J1 than that of an axially upper portion of the protruding portion 39. Accordingly, the protruding portion 39 can smoothly enter the space between the adjacent fins 22 constituting the side portion 231 while the strength thereof is maintained.

The shape of the protruding portion 39 is not limited to the substantially triangular pole shape. The protruding portion 39 may have various shapes such as a substantially circular column, a polygonal pole such as a substantially square pole, a substantially triangular pyramid, a substantially circular cone, or a substantially quadrangular pyramid. Alternatively, when the protruding portion 39 is viewed in the axial direction, an area enclosed by the outline of the protruding portion 39 may substantially be equal to an area enclosed by the outline of the pawl portion 362 (that is, when it is viewed in the axial direction, the sectional area of the protruding portion 39 may substantially be equal to the sectional area of the pawl portion 362). In an alternative configuration, the pawl portion 362 and the protruding portion 39 may be formed integrally, and slightly inserted into the space between the adjacent fins 22 constituting the side portion 231. In a desired shape, the shape may be tapered toward one side in the axial direction (in other words, a sectional area thereof in a plane perpendicular to the center axis J1 is gradually reduced in the axial direction). Such a tapered shape can be easily realized without taking time and cost, when the protruding portion 39 is formed together with the frame portion 30 by aluminum die-casting or injection molding using a resin. The reason why will be described below.

As described above, the protruding portion 39 desirably has a shape tapered toward one side in the axial direction. The tapered shape is advantageous in that when it is viewed in plan in the axial direction, all of the faces which constitute the protruding portion 39 are not overlapped. In other words, when it is viewed in plan in the axial direction, any blind area does not exist in the faces which constitute the protruding portion 39. When the protruding portion 39 and the frame portion 30 are formed by injection molding, a molten resin is injected into a metal die, the resin is cooled and hardened, and then the resin is removed from the metal die. As for the frame portion 30 and the protruding portion 39, the removing direction of the metal die used for the injection molding (i.e., the direction in which the frame portion 30 is removed from the metal die) is the axial direction. When the protruding portion 39 is viewed in plan in the metal-die removing direction, if there exists any recessed portion formed in a direction different from the metal-die removing direction, the portion will be a blind portion. If there exists any blind portion (any undercut portion), the metal die may be held up by the undercut portion when it is taken away. Thus, the metal die cannot directly be taken away. In the case where any undercut portion is produced in the protruding portion 39, it is necessary to provide means for undercut processing using a slide core structure or the like requiring another metal die which moves in a direction different from the metal-die removing direction. If the processing for the undercut portion is performed, the metal die is complicated, and the cost and the production time are disadvantageously increased. However, in the protruding portion 39 in the present invention, any undercut portion does not exist. Accordingly, it is unnecessary to perform the processing for the undercut portion, and the structure of the metal die is not complicated. Therefore, it is possible to easily form the protruding portion 39 by injection molding without taking time and cost.

As shown in FIGS. 1 and 3A, in the annular member 35, in addition to the first extending portion 36, a second extending portion 38 extending axially downwards is formed. The second extending portion 38 is disposed between the first extending portions 36 which are adjacent to each other in the circumferential direction. The second extending portion 38 axially adjoins a coupling position of the coupling member 34 with the annular member 35. The second extending portion 38 is radially opposite to the end face of the fins 22 on the radially outer side. Accordingly, even if the heat sink 2 and the cooling fan 3 are relatively moved in the radial direction by any impact or the like from the external, the relative movement of the cooling fan 3 to the heat sink 2 in the radial direction can be restricted. As a result, the heat sink 2 is stably held by the cooling fan 3.

Next, a second preferred embodiment of the present invention will be described. In the following description, portions and members in the second preferred embodiment which are the same as those in the first preferred embodiment are designated by the identical reference numerals.

Figure 4:
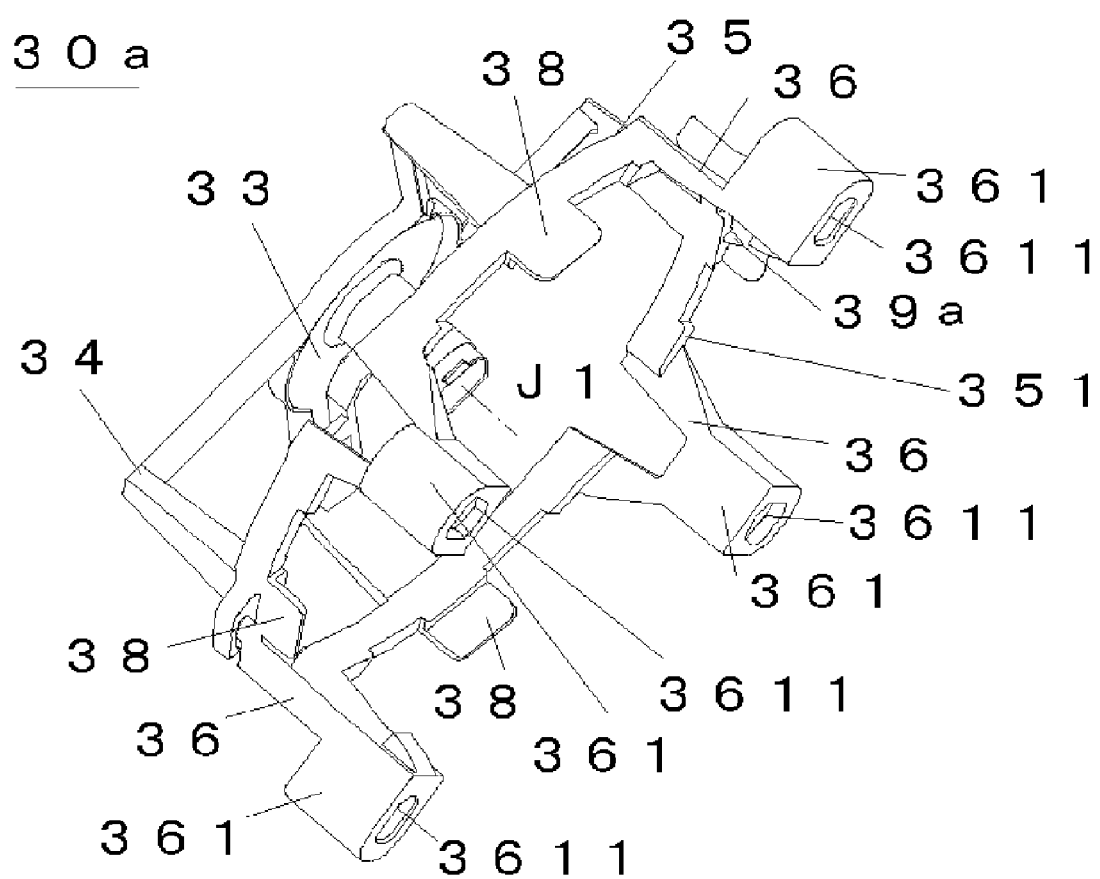
FIG. 4 is a perspective view of a frame portion of a cooling fan in a second preferred embodiment of the present invention.

The heat sink fan in the second preferred embodiment includes a heat sink 2 and a cooling fan. FIG. 4 shows a frame portion 30a of the cooling fan in the second preferred embodiment. The configuration of the frame portion 30a in the second preferred embodiment is substantially similar to that of the frame portion 30 of the cooling fan 3 in the first preferred embodiment. The configurations other than the frame portion 30a of the cooling fan in the second preferred embodiment are substantially the same as those in the first preferred embodiment, so that the descriptions thereof are omitted.

As shown in FIG. 4, the second preferred embodiment is different from the first preferred embodiment in that one protruding portion 39a protruding radially is formed on an inner side surface of one of the second extending portions 38 of the frame portion 30a. The protruding portion 39a has a substantially triangular pole shape which is tapered toward the lower side in the axial direction. Similarly to the first preferred embodiment, when the heat sink 2 and the cooling fan are combined, the protruding portion 39a enters into a space between adjacent fins 22 of the plurality of fins 22 constituting the arcuate portion 232 opposite to the corresponding second extending portion 38, and is sandwiched between the adjacent fins 22. Accordingly, similarly to the case of the first preferred embodiment, even when the heat sink 2 and the cooling fan are relatively moved in the circumferential direction by the impact or the like from the external, the relative movement of the heat sink 2 and the cooling fan in the circumferential direction is restricted by means of the protruding portion 39a. As a result, the heat sink 2 is stably held by the cooling fan.

In addition, similarly to the first preferred embodiment, the shape of the protruding portion 39a is not limited to the substantially triangular pole shape, but may be variously changed. In the second preferred embodiment, the shape of the protruding portion 39a is also tapered toward the lower side in the axial direction, so that the strength of the protruding portion 39a is maintained, and the protruding portion 39a can easily be fitted into the adjacent fins 22 constituting the arcuate portion 232. In addition, since the shape of the protruding portion 39a is tapered toward the lower side in the axial direction, when the protruding portion 39a is viewed in plan in the axial direction, all of the faces constituting the protruding portion 39a do not overlap. Accordingly, similarly to the first preferred embodiment, it is unnecessary to perform the undercut process, and the shape of the metal die is not complicated. As a result, the protruding portion 39a can be easily formed by injection molding without taking time and cost.

In the second preferred embodiment, only one protruding portion 39a is formed on one second extending portion 38. Alternatively, protruding portions 39a may be formed respectively on a plurality of second extending portions 38 or all of the second extending portions 38. In the case where a plurality of protruding portions 39a are formed, the protruding portions 39a are formed on the second extending portions which are disposed symmetrically with respect to the center axis J1. As compared with the case where only one protruding portion 39a is formed, when any impact or the like is made from the external, a stress exerted on one protruding portion can be decreased, and the relative movement of the heat sink 2 and the cooling fan can be further restricted. As a result, the heat sink 2 can be stably held by the cooling fan.

Next, a heat sink fan according to a third preferred embodiment of the present invention will be described. In the third preferred embodiment, the configuration of a frame portion of a cooling fan attached to a heat sink 2 is different from that in the first and second preferred embodiments. The other configurations are substantially the same. In the following description, the same portions and members as those in the first and second preferred embodiments are designated by the identical reference numerals, and the detailed descriptions thereof are omitted.

Figure 5:
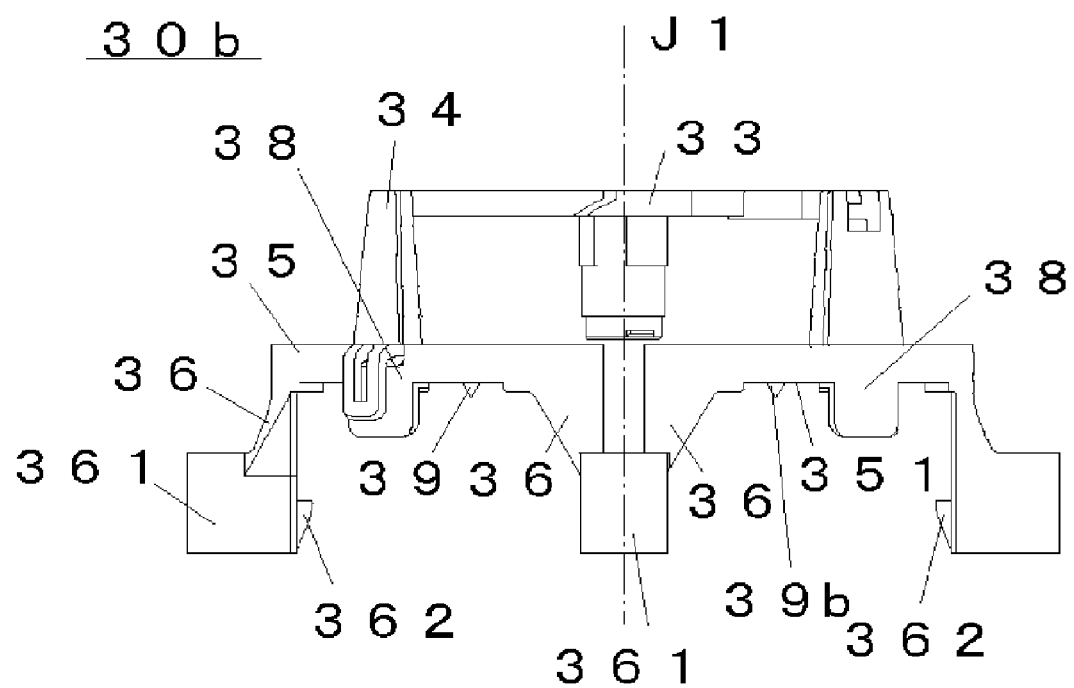
FIG. 5 is a side view of a frame portion of a cooling fan in a third preferred embodiment of the present invention.

As shown in FIG. 5, similarly to the first and second preferred embodiments, a frame portion 30b includes a base portion 33, a coupling member 34, an annular member 35, a first extending portion 36 having a cylindrical member 361 and a pawl portion 362, and a second extending portion 38.

The third preferred embodiment is different from the first and second preferred embodiments in that two protruding portions 39b are formed on the annular member 35. As shown in FIG. 5, the annular member 35 is a substantially annular member having a bottom face 351 which is substantially perpendicular to the center axis J1. Each of the protruding portions 39*b* has a substantially triangular pole shape which extends in the axial direction from the bottom face 351, in a similar manner to the first extending portion 36 and the second extending portion 38. When the heat sink 2 and the cooling fan are combined, the protruding portion 39*b* is fitted into a space between adjacent fins 22 of the heat sink 2. Accordingly, similarly to the first and second preferred embodiments, even when the heat sink 2 and the cooling fan are to be relatively moved in the circumferential direction by any impact or the like from the external, the relative movement of the heat sink 2 and the cooling fan in the circumferential direction is restricted because the protruding portions 39*b* are sandwiched by the adjacent fins 22. As a result, the heat sink 2 is stably held by the cooling fan.

On condition that the protruding portion 39*b* enters into a space between the adjacent fins 22, the protruding portion 39*b* may be formed in any position on the annular member 35. The number of the protruding portions 39*b* formed on the annular member 35 is not limited to two, but a plurality of protruding portions 39*b* may be formed. In the case where a plurality of protruding portions 39*b* are formed on the surface of the annular member 35, the protruding portions 39*b* may be distributed equally or unequally with respect to the center axis J1. By forming a plurality of protruding portions 39*b*, when any impact or the like is made from the external, a stress exerted on one protruding portion 39*b* is dispersed, so that the breakage of the protruding portion 39*b* can be prevented.

Moreover, similarly to the first and second preferred embodiments, the protruding portion 39*b* desirably has a shape which is tapered toward the lower side in the axial direction. Accordingly, the same effects as those in the first and second preferred embodiments can be attained.

Next, a heat sink fan according to a fourth preferred embodiment of the present invention will be described. In the fourth preferred embodiment, the configurations of a heat sink 2*a* and a frame portion of a cooling fan attached to the heat sink 2*a* are different from those in the first, second, and third preferred embodiments, but the other configurations are substantially the same.

Figure 6:
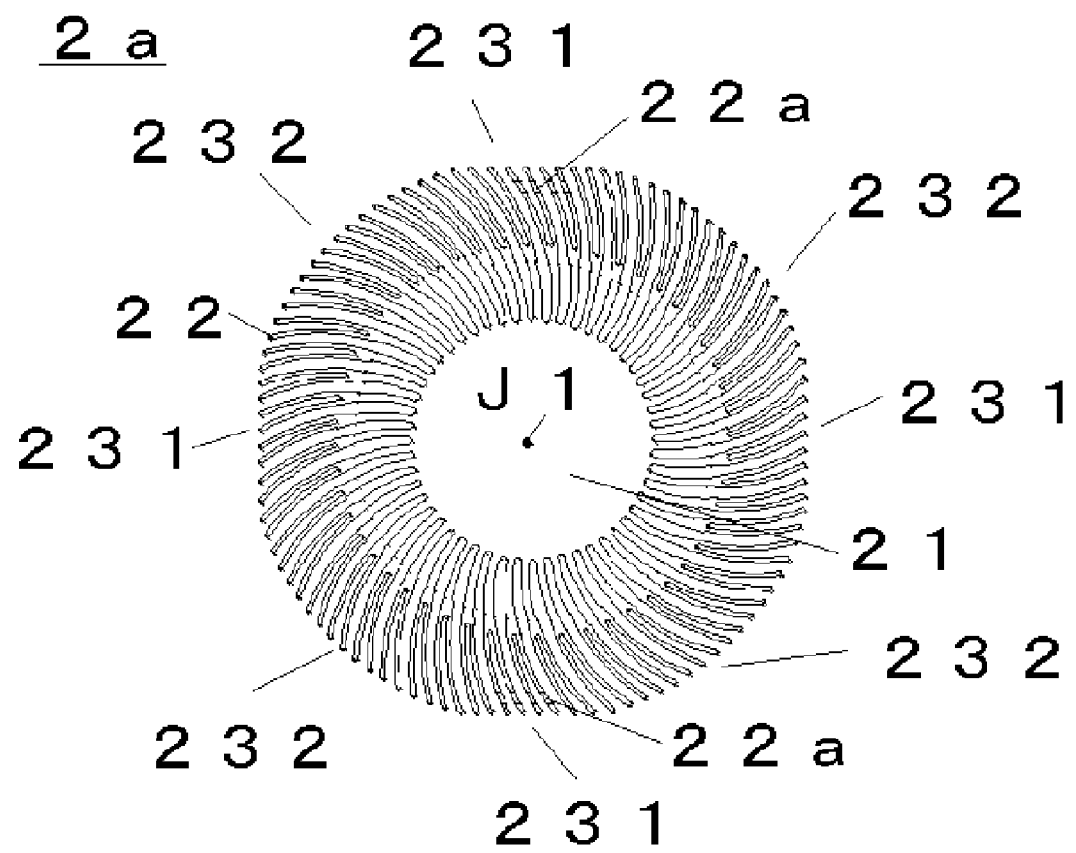
FIG. 6 is a bottom view of a heat sink in a fourth preferred embodiment of the present invention.

FIG. 6 is a bottom plan view of a heat sink 2*a* in the fourth preferred embodiment. As shown in FIG. 6, similarly to the heat sink 2, the heat sink 2*a* includes a base 21, fins 22, side portions 231, and arcuate portions 232. On an axially end face of the heat sink 2*a* on the side on which the heat sink 2*a* abuts against an MPU (i.e., on a surface on an opposite side to the side on which the cooling fan is disposed in the axial direction), a plurality of recessed portions 22*a* (two in this embodiment) are formed. The recessed portion 22*a* is formed by notching part of fins 22 constituting the side portion 231 by cutting, and defined by an envelope surface 23 obtained by tracing the notched portions in the circumferential direction. In this embodiment, two protruding portions 39*c* are disposed radially opposite to each other with respect to the center axis J1. The recessed portions 22*a* in this embodiment are formed by cutting after the outer shape of the heat sink 2 is formed. However, the process for forming the recessed portions 22*a* is not specifically limited to the cutting.

Figure 7:
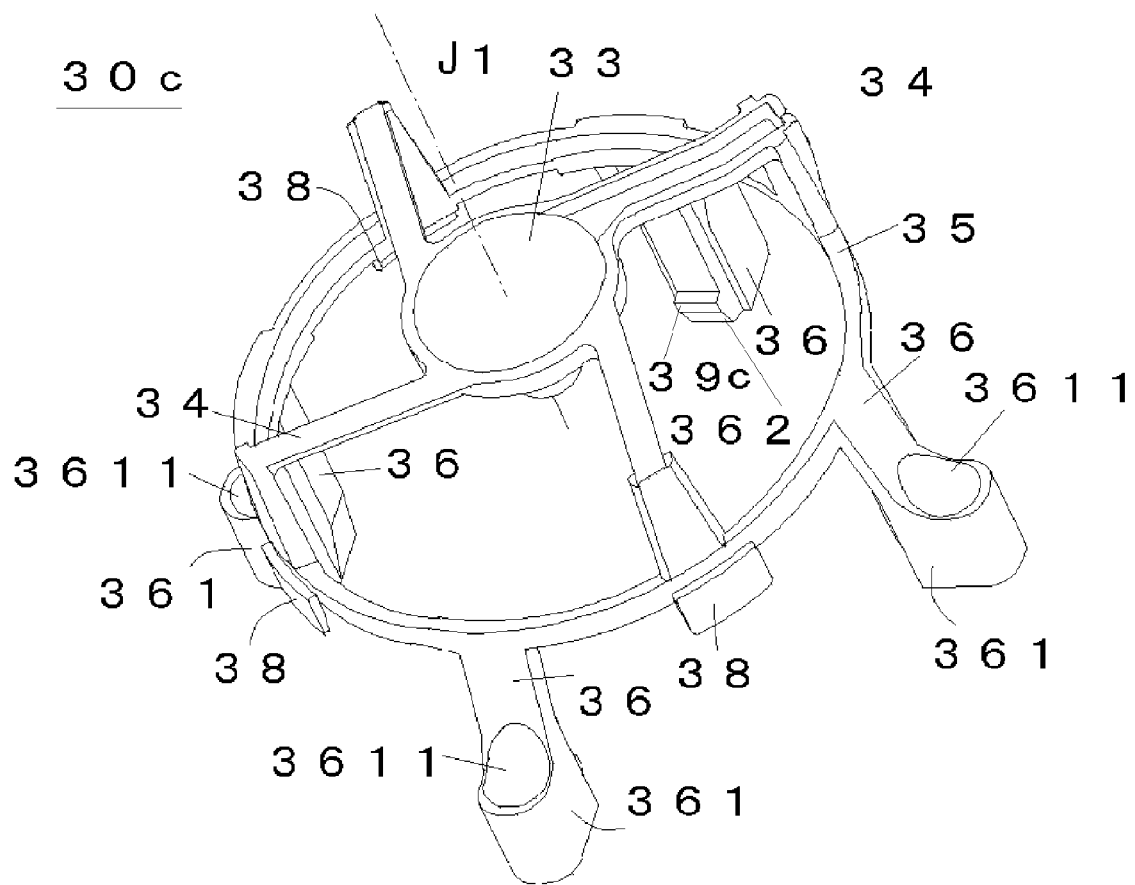
FIG. 7 is a perspective view of a frame portion of a cooling fan in the fourth preferred embodiment.

FIG. 7 is a perspective view of a frame portion 30*c* in the fourth preferred embodiment. As shown in FIG. 7, similarly to the first, second, third preferred embodiments, the frame portion 30*c* includes a base portion 33, a coupling member 34, an annular member 35, a first extending portion 36 having a cylindrical member 361 and a pawl portion 362, and a second extending portion 38.

As shown in FIG. 7, in this embodiment, two protruding portions 39*c* are formed on the axially upper side of the pawl portion 362 of the first extending portion 36. The protruding portion 39*c* is formed integrally with the pawl portion 362 by injection molding. The protruding portion 39*c* has a width equal to the width of the pawl portion 362 in the circumferential direction with respect to the center axis J1.

When the heat sink 2*a* is combined with the cooling fan having the frame portion 30*c*, the protruding portions 39*c* are engaged with the recessed portions 22*a* of the heat sink 2. Accordingly, even when the heat sink 2*a* and the cooling fan having the frame portion 30*c* are to be relatively moved in the circumferential direction by any impact or the like from the external, the relative movement of the heat sink 2*a* and the cooling fan having the frame portion 30*c* in the circumferential direction is restricted by the protruding portions 39*c*. Accordingly, the heat sink 2*a* is stably held by the cooling fan having the frame portion 30*c*.

The protruding portion 39*c* has a face which is substantially parallel to the axially end face of the heat sink 2*a* on the side on which the heat sink 2*a* abuts against the MPU (i.e., the face on the side opposite to the side on which the cooling fan is disposed in the axial direction). Accordingly, when the heat sink 2*a* is viewed in plan in the axial direction, all faces constituting the protruding portion 39*c* do not overlap. Therefore, similarly to the first, second, and third preferred embodiments, it is unnecessary to perform the undercut process, and the shape of the metal die is not complicated. As a result, the protruding portion 39*c* can be easily formed by injection molding without taking time and cost.

In this embodiment, the width of the recessed portion 22*a* and the width of the protruding portion 39*c* in the circumferential direction are substantially equal to the width of the pawl portion 362 in the circumferential direction. However, the circumferential widths of the recessed portion 22*a* and the protruding portion 39*c* may be larger or smaller than the circumferential width of the pawl portion 362. Alternatively, the recessed portion 22*a* and the protruding portion 39*c* may protrude to the outer side (in the radial direction or in the circumferential direction) from the outer shape of a face constituting the pawl portion 362.

The shape of the protruding portion 39*c* may be a polygonal pole shape such as a substantially square pole shape or a substantially triangular pole shape, a substantially circular cone shape, a substantially polygonal pyramid shape, a substantially hemisphere shape, or the like. The shape of the protruding portion 39*c* is not specifically limited. Similarly to the protruding portion in the first, second and third preferred embodiments, the shape of the protruding portion 39*c* may be tapered in the extending direction. As for the desirable shape of the protruding portion 39*c*, when they are viewed in plan in the axial direction, all of the faces constituting the protruding portion 39*c* do not overlap. The recessed portion 22*a* desirably has a shape which can be engaged with the protruding portion 39*c*, and can be formed by cutting.

Figure 8:
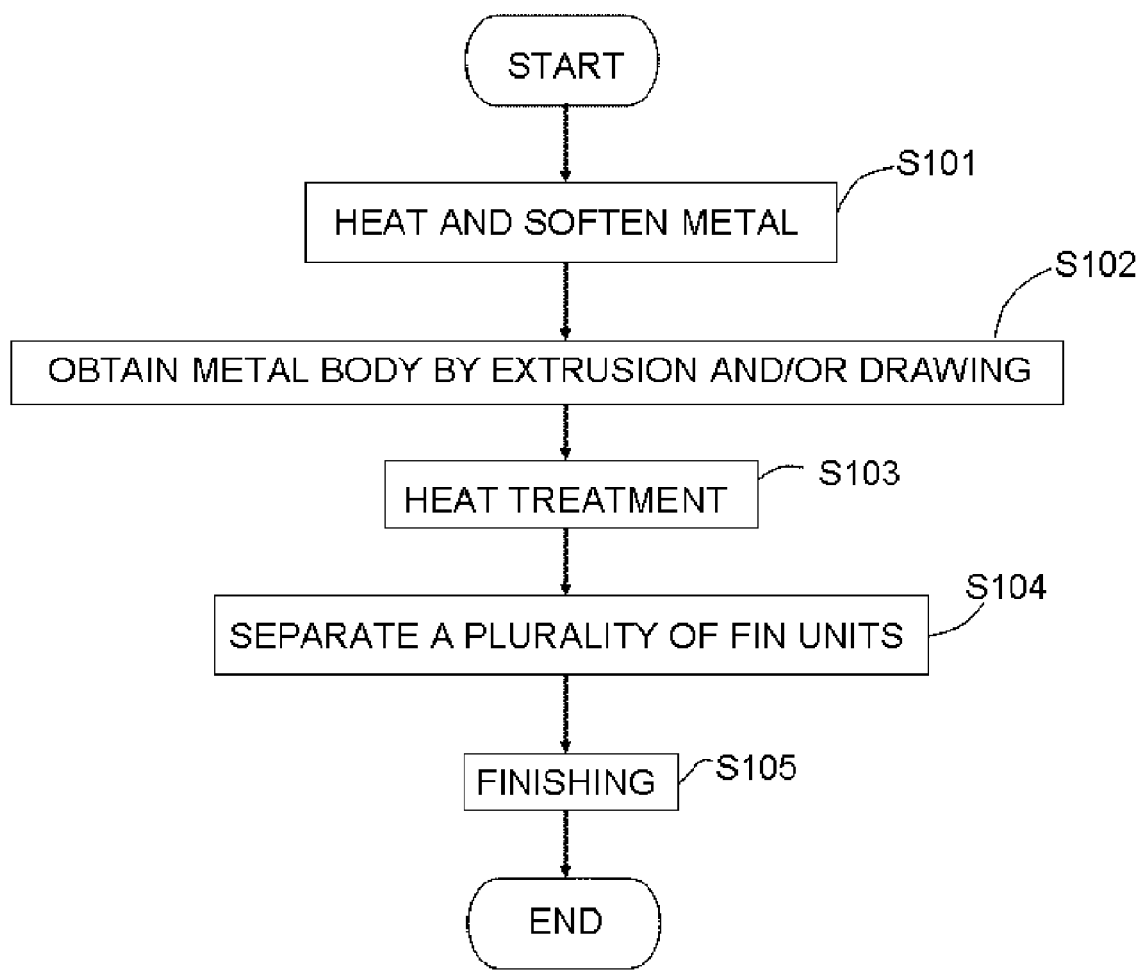
FIG. 8 is a flowchart of a manufacturing process of a heat sink.

Next, the production process of the heat sink 2 will be described. FIG. 8 shows the process for producing the heat sink 2. As described above, in this embodiment, the heat sink 2 is made from a metal material such as aluminum, aluminum allow, or copper with high thermal conductivity which can be processed by extrusion or drawing process. In the following description, aluminum or aluminum alloy is used as the material for the heat sink 2.

Figure 9:
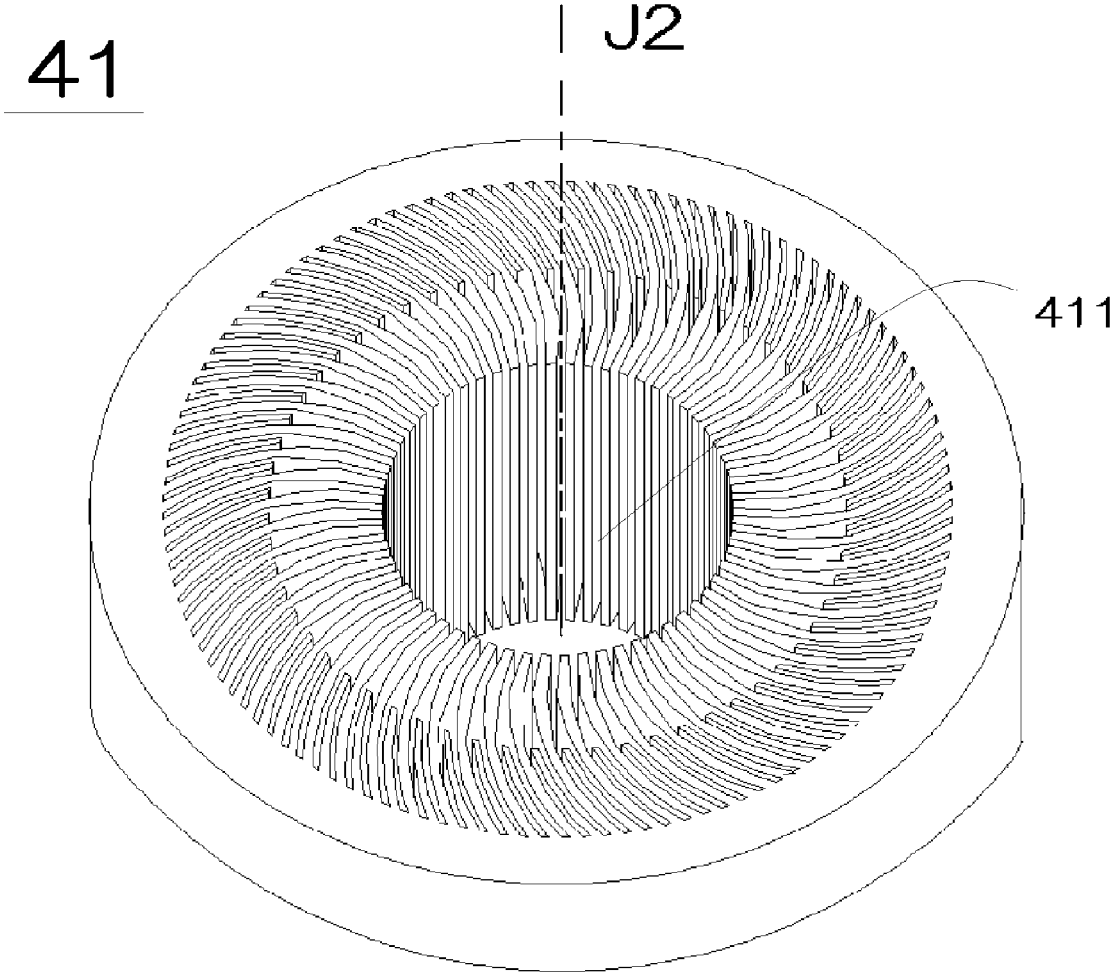
FIG. 9 is a perspective view of a die.

When the heat sink 2 is to be produced, a substantially columnar billet of aluminum or aluminum alloy (hereinafter referred to as a metal material) is first heated up to about 500° C., so as to be in a softened state (Step S101). Next, the metal material is inserted into a processing apparatus 40 which performs extrusion or drawing. After the metal material is made into a substantially columnar shape, for example, in the processing apparatus 40, the metal material is pressed against a die 41 by an extrusion (or drawing) mechanism driven by a servo motor, or the like. As shown in FIG. 9, the die 41 has a substantially planar shape, and a die hole 411 corresponding to the base 21 and the plurality of fins 22 is formed. The center axis J1 of the base 21 corresponds to a center axis J2 of the die hole 411 of the die 41.

Figure 10:
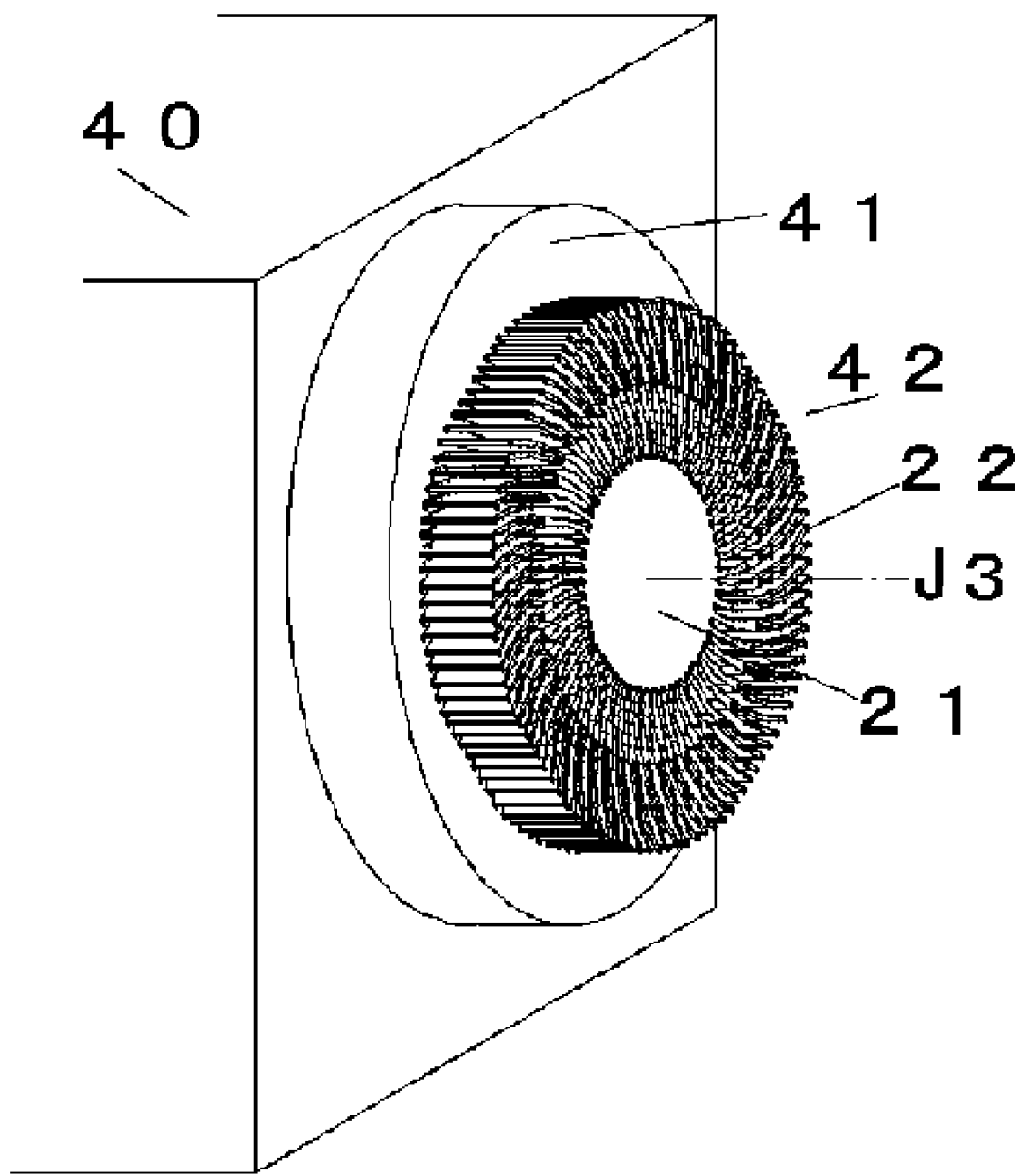
FIG. 10 is a perspective view of a heat sink in the manufacturing process.

As shown in FIG. 10, the metal material 42 of the substantially columnar shape pressed against a surface on one side of the die 41 is extruded (or drawn) to the other side via the die hole 411, thereby forming a metal continuous body 42 in which portions to be the plurality of fins 22 and the base 21 continue in the direction along the center axis J2 (Step S102). A center axis J3 of the metal continuous body 42 corresponds to the center axes J1 and J2 of the base 21 and the die 41.

Thereafter, the metal continuous body 42 is cooled by air blow by an air blower, or the like, and then the metal continuous body 42 is carried into a hardening furnace. In the furnace, the hardening at about 185° C. is performed for the metal continuous body 42 (Step S103). Then, the metal continuous body 42 is cooled by water or air. Thereafter, the metal continuous body 42 is cut in a plurality of positions in a longitudinal direction (the direction along the center axis J3) (Step S104). Accordingly, a heat sink 2 having fins 22 and a base 21 can be obtained. The hardening step may be performed for each heat sink 2 after the heat sink 2 is obtained by cutting the metal continuous body 42 in the plurality of positions.

In the above-described method, the heat sink 2 is formed by integrally molding the base 21 and the fins 22, but they can be separate members. Alternatively, the base 21 and the fins 22 may be formed as separate members, and they may be assembled so as to form the heat sink 2. For example, a substantially cylindrical hollow portion is formed in a center portion of the base 21. Into the hollow portion, a core having a substantially columnar shape of a material having a higher thermal conductivity than that of the material of the base 21 is press-fitted and fixed. Then, the core is made into contact with the portion to be cooled via a thermal tape, thermal grease, or the like. Accordingly, the heat dissipation efficiency of the heat sink 2 can be further increased. The use of a material having a high thermal conductivity such as copper as the main material for the heat sink 2 suitably increases the heat dissipation efficiency. However, there is a problem in that copper has a heavy weight, and has worse precision in extrusion molding as compared with aluminum. In the case where the heat dissipation efficiency of the heat sink 2 formed only by using aluminum is not good, or in the case where the weight of the heat sink 2 integrally formed by using copper is heavy, the above-described method is employed.

Next, the production method of a cooling fan will be described. In the cooling fan in the first preferred embodiment of the present invention, other than the impeller portion 31 and the motor portion 32, the frame portion 30 is integrally formed by injection molding using a resin. Hereinafter, the production process of the frame portion 30 is described, but the frame portions 30a and 30b in the second and third preferred embodiments of the present invention can be produced by substantially the same production process.

Figure 11:
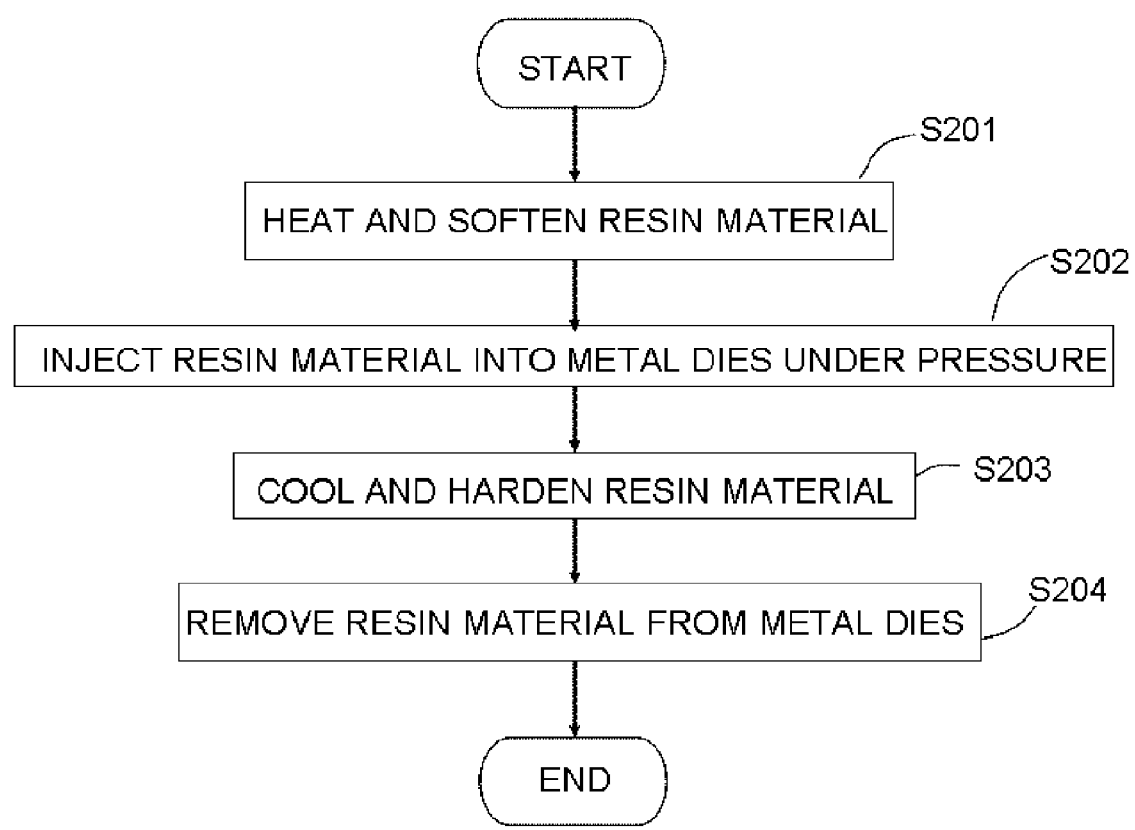
FIG. 11 is a flowchart of a manufacturing process of a cooling fan.

As shown in FIG. 11, in the injection-molding machine, a resin material as the material for the frame portion 30 is heated and molten (step S201). Then, the molten resin is injected into metal dies constituted by two kinds of dies, i.e., a fixed metal die and a movable metal die, via a gate (a port through which the material such as a resin is injected) under pressure (Step S202). The two kinds of metal dies, i.e., the fixed metal die and the movable metal die, have shapes corresponding to the frame portion 30, respectively. Thereafter, the resin material is cooled together with the metal dies (step S203). When the resin material is hardened to some degree, the resin material is extruded and removed from the metal dies by means of an ejector pin or the like (Step S204). As described above, all of the faces constituting the protruding portion 39 are visible when the protruding portion 39 is viewed from the removing direction of the metal dies. For this reason, the metal die can be smoothly removed. Then, the motor portion 32 is attached to the base portion 33 of the frame portion 30, and the impeller portion 31 is attached to the motor portion 32, thereby producing the cooling fan 3.

As for the impeller cup 311 and the plurality of vanes 312 of the impeller portion 31, they are integrally formed by injection molding through the same process steps.

Then, the heat sink 2 and the cooling fan 3 which are produced through the above-described process steps are assembled into a single body. At this time, the first extending portion 36 faces the side portion 231, and the second extending portion 38 faces the arcuate portion 232. In addition, as described in the first, second, and third preferred embodiments, one or more protruding portions in at least one of the first extending portion 36, the second extending portion 38, and the annular member 35 is fitted into a space between adjacent fins 22 of the heat sink 2, and is sandwiched by the corresponding fins 22. As the result of the assembling, a heat sink fan 1 is produced. In the heat sink fan 1, the relative movement of the heat sink 2 and the cooling fan 3 in any one direction of the axial direction, the radial direction, and the circumferential direction is restricted, and the heat sink 2 and the cooling fan 3 are mutually stably held.

The preferred embodiments of the present invention are described above, but the present invention is not limited to the above-described embodiments. Alternatively, at least two or more of the first, second, third, and fourth embodiments may be combined. In addition, the shape and the position of the protruding portion are not specifically limited to those described above.

What is claimed is:

1. A heat sink fan comprising a heat sink and a fan,
   the heat sink including:
   a base having a center axis; and
   a plurality of fins extending radially outwardly from an outer circumferential surface of the base, the plurality of fins being disposed in a circumferential direction; and
   the fan including:
   an impeller portion disposed adjacent to the heat sink in a direction extending along the center axis, the impeller portion rotating about the center axis; and
   a frame portion, including at least one protruding portion, the frame portion arranged to cover and fix the impeller portion, a portion of the frame portion being opposed to the heat sink; wherein
   the at least one protruding portion is arranged in a space between the plurality of fins which are adjacent to each other; and
   the at least one protruding portion is arranged on a parallel face of a pawl portion protruding radially inwardly from the frame portion, the parallel face of the pawl portion is arranged to contact end faces of less than all of the plurality of fins.

2. A heat sink fan according to claim 1, wherein
   the frame portion includes an annular member arranged to enclose the impeller portion, the annular member being opposed to the heat sink in the direction along the center axis.

3. A heat sink fan according to claim 1, wherein the frame portion includes, a plurality of first extending portions extending from the annular member in the direction along the center axis, at least a portion of the first extending portions being opposed to the fins in a radial direction, each of the first extending portions including a cylindrical portion at its end in the direction along the center axis, and the pawl portion protruding radially inwardly from an outer face of the cylindrical portion.

4. A heat sink fan according to claim 1, wherein the frame portion includes:

a base portion to which the impeller portion is fixed, the base portion being opposed to the impeller portion in the direction along the center axis; and a coupling member arranged to couple the base portion to the annular member.

5. A heat sink fan according to claim 1, wherein the at least one protruding portion is tapered toward its extending direction.

6. A heat sink fan according to claim 1, wherein when viewed from the direction along the center axis, an outer shape of the heat sink is defined by at least one arcuate portion which is substantially arcuate with respect to the center axis, and at least one side portion which is substantially linear, and a first extending portion is opposed to the side portion.

7. A heat sink fan according to claim 6, wherein a space in the circumferential direction between the fins defining the side portion is smaller than a space in the circumferential direction between the fins defining the arcuate portion.

8. A heat sink fan according to claim 1, wherein when the at least one protruding portion and the pawl portion are viewed from the direction along the center axis, an area enclosed by an outer shape of the at least one protruding portion is substantially equal to an area enclosed by an outer shape of the pawl portion.

9. A heat sink fan according to claim 1, comprising at least one recessed portion arranged on the heat sink which is recessed in the direction along the center axis, the recessed portion being engaged with the at least one protruding portion.

10. A heat sink fan according to claim 7, wherein the at least one protruding portion is arranged in the space between the adjacent fins defining the side portion.

* * * * *